April 28, 1970 M. J. DUBE ET AL 3,509,270

INTERCONNECTION FOR PRINTED CIRCUITS AND METHOD OF MAKING SAME

Filed April 8, 1968

INVENTORS
MILFORD J. DUBE
HARRY P. YORGENSEN

BY Peter L. Costas
ATTORNEY

United States Patent Office 3,509,270

Patented Apr. 28, 1970

3,509,270

INTERCONNECTION FOR PRINTED CIRCUITS AND METHOD OF MAKING SAME

Milford J. Dube, Windsor Locks, and Harry P. Yorgensen, Manchester, Conn., assignors to The J. M. Ney Company, Bloomfield, Conn., a corporation of Connecticut Filed Apr. 8, 1968, Ser. No. 719,636
Int. Cl. H05k *1/04, 3/06*
U.S. Cl. 174—68.5 17 Claims

ABSTRACT OF THE DISCLOSURE

There is disclosed a printed circuit board assembly which comprises an insulating body, a pair of printed circuit members and an electrically conductive spring. The insulating body has an aperture into which the spring is inserted, and one of the printed circuit members is secured to each side of the body with a portion of an electrical circuit thereof extending into alignment with the aperture. The spring in the aperture is in electrical contact with the surface of the aligned portions of the circuits to provide an electrical connection therebetween.

BACKGROUND OF THE INVENTION

Circuit members having electrically conducting metal patterns, commonly referred to as "printed circuit boards," are widely employed in industrial and military applications and in a broad range of electrical and electronic consumer products. Frequently it is desirable to provide two or more of such printed circuit members in a single sub-assembly and it often is necessary, therefore, to provide interconnections between the circuits of the assembled circuit members. A wide variety of structures and techniques have been described or utilized in the art for achieving the desired electrical connections; however, the products resulting from such prior art methods have not proven wholly satisfactory for one or more reasons or have been relatively expensive.

One of the deficiencies associated with many of the printed circuit board assemblies available is their tendency to be quite unreliable and subject to inoperability after relatively short periods of use, particularly when the assemblies are utilized in applications in which they are subjected to vibration, physical or thermal shock, or to significant temperature fluctuation. Many of the prior assemblies have uneven surfaces due, in some cases, to the presence of elements used for the interconnection, making them unsuitable or less desirable for use in applications where flush surfaces are necessary, such as with moving contacts. In some instances the prior art devices are too large for certain applications as a result of the presence of necessary auxiliary contact structure which takes up surface area or due to other characteristics of the interconnection method. A very significant drawback of many prior devices is their excessive cost, resulting from expenditures for manpower and materials and from excessive rejects.

Accordingly, it is an object of the present invention to provide printed circuit assemblies which are relatively inexpensive and simple to manufacture and which are highly reliable, durable, and resistant to damage or malfunction as a result of exposure to heat, vibration or shock.

It is also an object to provide such assemblies which are highly adaptable and which have flat, flush surfaces.

It is a further object to provide a method of producing durable, utilitarian and attractive assemblies of printed circuits, which method is inexpensive and facile and which allows the production of products of consistently high quality.

SUMMARY OF THE INVENTION

It has now been found that the foregoing and related objects can be readily attained in a printed circuit assembly which comprises an insulating body, a pair of printed circuit members and an electrically conductive compressible spring. The insulating body has an aperture therethrough, and a printed circuit member is secured on each side of the body with a portion of an electrical circuit thereof extending into alignment with the aperture. The spring is retained in the aperture and has its ends in electrical contact with the surface of the portions of the circuits which extend into alignment therewith to provide an electrical connection there-between. In one embodiment of the invention, the body and circuit members are secured by a film of synthetic resin interposed therebetween and functioning as a bonding layer. In other embodiments the spring and electrical circuits are comprised of a noble metal, e.g., a gold alloy, and the preferred circuit members utilize a wrought metal foil.

In the method for making the printed circuit assembly, an electrically conductive compressible spring is positioned in an aperture formed through an insulating body. A printed circuit member is positioned adjacent each surface of the insulating body with layers of bonding material interposed therebetween. The body, layers and printed circuit members are brought into contact under conditions sufficient to cause the layers of bonding material to secure them in assembly with the spring in the aperture extending between the circuit members to provide electrical connection therebetween. The bonding layer is conveniently in the form of a sheet or film of resinous material and the body, layers, and circuit members are contacted under conditions which render the resinous material adhesive.

DESCRIPTION OF THE PREFERRED EMBODIMENTS

Figure 2:
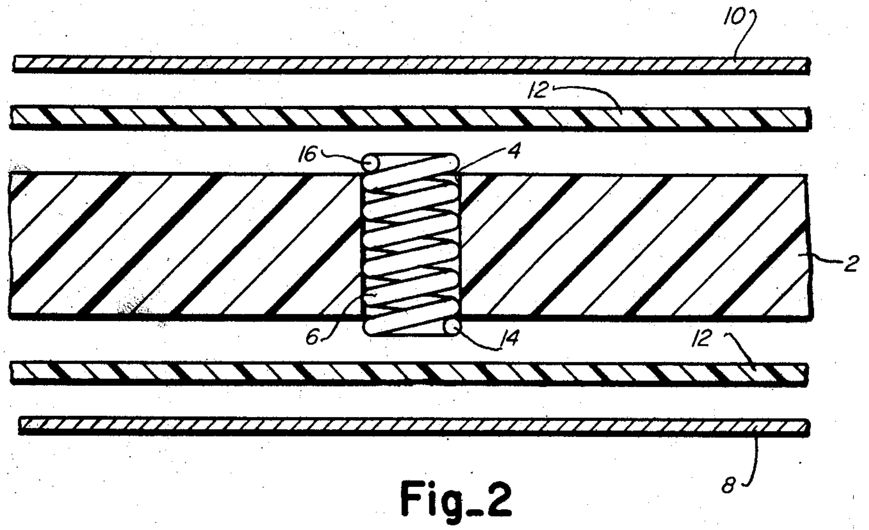
FIGURE 2 is an exploded view thereof to illustrate the relationship of the parts prior to assembly.
Figure 1:
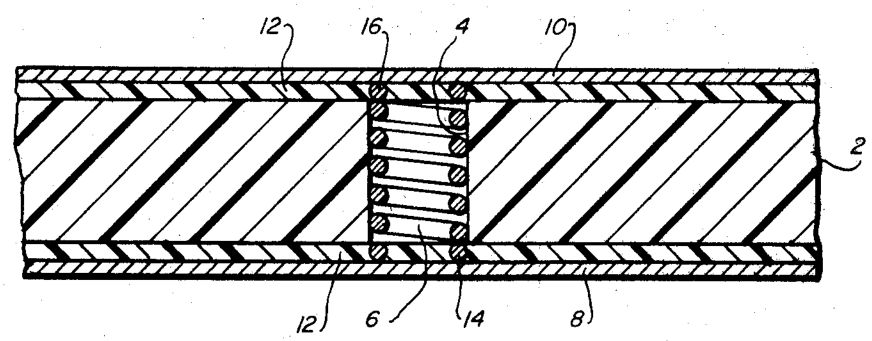
FIGURE 1 is a fragmentary cross-sectional view of a printed circuit assembly embodying the present invention.

In the drawing there is illustrated a printed circuit assembly embodying the present invention wherein an insulating body 2 has an aperture 4 extending therethrough with a compression spring 6 inserted therein. A first electrically conducting circuit member 8 is positioned on one side of the insulating body 2 and a second electrically conducting circuit member 10 is positioned on the opposite side. Resinous bonding layers or films 12 interposed between the body 2 and the members 8, 10 secure them in assembly with the spring 6 compressed in the aperture 4. One end 14 of the spring 6 is in surface contact with the portion of the conducting member extending below the aperture 4 and the other end 16 of spring 6 is in surface contact with the portion of the member 10 extending above the aperture 4. As is seen in FIGURE 2, the resinous bonding interlayers 12 are the form of a film prior to assembly in accordance with a preferred embodiment of the invention. In assembly, the ends 14, 16 of the spring 6 extend through the layers 12 and into surface contact with the members 8, 10.

The insulating body should have good dielectric and thermal properties, in addition to high strength and toughness, and, for certain uses, it should be relatively flexible. Although the illustrated insulating body is composed of a synthetic resin, other materials may also be utilized such as the natural or synthetic rubbers, glass, asbestos, suitably surface treated metals (e.g., anodized aluminum) and composites including the foregoing. The thermosetting resins such as phenol aldehydes, melamines and epoxy materials are generally preferred over the thermoplastic resins. Both types of resins are preferably reinforced with fillers such as glass, mineral or ceramic fibers and plastic-impregnated glass cloth and paper laminates have proven particularly effective.

The aperture which is provided to receive the spring for interconnecting the circuits of the printed circuit members may be of virtually any size or shape, depending primarily upon the size and configuration of the spring to be contained therein. It will be appreciated that the configuration of the aperture should allow relatively little radial movement of the spring therein so that misalignment during assembly is prevented. It is essential, however, that the aperture be sufficiently large to allow the spring to expand and compress freely therein, at least during initial assembly, to ensure that a positive electrical contact is made with the current carrying circuits of the assemblies. The manner of producing the aperture in the insulating body depends primarily upon the specific material being used therefor, and it will be appreciated that the synthetic resins are advantageous in this regard since apertures may be created therein with great facility and by many different methods such as drilling, punching, molding, etc. Although only one spring will normally be required for connecting two circuits, it may be desirable to connect them at more than one location. When one or both of the circuit members contains two or more separate or independent circuits, a plurality of apertures with springs therein will be necessary to connect the circuits of the two members. Accordingly, one or a multiplicity of apertures and springs may be utilized.

The structure of the printed circuit members may vary considerably and may be provided in a number of different ways. For example, a metal foil may be bonded directly to the insulating body and subsequently etched to provide a printed circuit member, the etched-out areas normally being filled with a flushing agent. Alternatively, an electrically conducting member performed in a circuit or pattern of conductive material can be secured to the body. Since, however, these metallic elements tend to be quite thin and fragile, being on the order of about 1 to 10 mils in thickness, a backing member will often be used to provide support for them, and this is particularly true in the case of the preformed circuit patterns which are normally very delicate. The term "electrically conducting member," as used herein, is inclusive of both the unetched foils and the preformed patterns of conductive material, whether or not a backing member is associated with them and whether or not the patterns are flushed or contain a matrix of non-conducting material between portions thereof.

Various techniques may be used to form the printed circuits including stamping, etching and plating. When a foil is used, it will normally be etched with a suitable chemical etchant, either after application of the foil to the insulating body or prior thereto, preferably on a backing member. Alternatively, the conductive pattern may be plated upon a backing by means of a silk screened or photoresist pattern and subsequently assembled with the body. Particularly desirable printed circuit members are provided from gold alloys in accordance with Bogue and Passborg United States Patent No. 3,131,103.

Essentially any good electrical conductor may be employed for the electrically conducting members in the present assemblies including essentially pure metals such as copper, gold, aluminum and silver, and alloys thereof such as beryllium-copper and Phosphor bronze. For use in the more sensitive or sophisticated applications where corrosion resistance or low contact noise with moving contacts is necessary, alloys of the noble metals such as gold and gold/platinum are of outstanding value due to their outstanding resistance to corrosion and very low contact noise level.

If a backing member is employed, it should be of sufficient thickness to provide adequate support during processing, and for this purpose such members will generally be about 1/64 to 1 inch thick, and more commonly about 1/16 to 1/4 inch in thickness. When such a member is used, its nature will depend largely upon the particular method used for producing the circuits and the assembly procedure. The particular method employed to remove a temporary backing will depend largely upon the specific materials used for the backing and for the remainder of the assembly so that only the unwanted portions are removed. Exemplary of the materials which are suitable for the backing member are the thermosetting and thermoplastic resins, impregnated cloths, paper laminates, ceramics, etc., hereinbefore described.

As has been mentioned, the printed circuit may be produced by applying a photoresist pattern to a backing followed by plating to produce a conductive pattern in the areas not covered by the photoresist material. If the temporary backing is itself electrically conductive, such as when a metal is used, the plating may be effected directly upon it. When the backing member is in a plastic, a conductive layer is applied by an electroless technique before the plating step can be carried out.

There is significant advantage in the use of a foil for the conducting members since, among other things, the foil may be a wrought metal which has been work hardened or age hardened at a low temperature to provide optimum characteristics of strength and durability and to provide very smooth, uniform surfaces. The foil and temporary backing, if used, may be joined with an adhesive depending upon the method to be employed for removal of the backing member. A synthetic plastic backing sometimes may be bonded directly to the metal foil by application of heat and pressure although a layer of adhesive will normally be used with metallic and nonmetallic backings.

A conductive pattern on a backing will normally be filled with a suitable material such as a thermoplastic or thermosetting resin to form a flush surface. The thermosetting plastics, such as the epoxies, melamine-aldehydes and nitrile-phenolics, are generally preferred as the filling materials since optimum thermal resistance, dielectric properties and strength are provided thereby. Instead of a separate resin to provide the flush surface, it is feasible to bond the uneven surface of the circuit directly to the insulating body with the bonding interlayer between the insulating body and the printed circuit board being relied upon to fill any voids between portions of the conductive pattern.

The spring used should be sufficiently long to protrude from the aperture on both sides of the insulating body before being compressed, and it should develop sufficient pressure in its compressed state to ensure that the ends will be forced through any bonding interlayer which may be used and will bear against the conductive surfaces, i.e., portions of the ultimate circuits, of the printed circuit members secured to both sides of the body. Although a fairly significant pressure on the circuit portions is desirable to ensure a good electrical contact and to reduce resistance at the interface of the spring and current-carrying element, too great a pressure will tend to cause an undue amount of distortion, or even rupture of the circuit element. This will, of course, depend upon the thickness of the conductive pattern and the energy of the spring in its compressed state.

Essentially any electrically conducting metal that is sufficiently elastically deformable may be used for the spring. Although the low resistance alloys such as beryllium-copper are among the preferred materials for this application, the ferrous alloys such as stainless steel are also suitable. It will often be desirable to plate such springs with a noble metal, such as gold, to enhance corrosion resistance and improve the conductivity thereof.

Precious metal alloys may desirably be used for the spring material for space applications or in highly corrosive environments, such as gold alloy containing platinum, silver, copper and zinc.

Although it is not necessary to provide a metallurgical bond between the spring and the current-carrying elements of the printed circuit since the spring ends can be formed to seat in firm surface contact, a metallurgical bond can be provided between the spring ends and the current-carrying elements. To this end, a metal which softens at a relatively low temperature may be interposed between the spring ends and the current-carrying elements so that upon subsequent exposure of the assembly to an elevated temperature the metal will melt and bond the spring to the elements. This is conveniently effected by applying a coating of a suitable solder, or the like, to one of the components, most effectively the spring. However, other methods of creating metallurgical bonds also may be utilized.

Although the electrically conducting members may be secured to the insulating body by the use of a coating of adhesive on either the insulating body and/or the conducting members, the use of a film of bonding material interposed between the insulating body and the conducting members greatly facilitates the assembly operation. One advantage of the use of such films is that they can effectively retain the springs in the aperture while the electrically conducting members are being positioned relative thereto, and this is particularly significant when the conductive patterns are formed prior to the assembly, it being essential that the proper portion of the circuit be aligned with the apertures.

Although the composition of the films may vary significantly and be solvent activated, the preferred compositions are heat activatable to provide an adhesive interlayer. Thermoplastic resins such as vinyl chloride and its copolymers, synthetic rubbers such as polybutadiene and its copolymers, and olefin copolymers may be employed for this purpose; however, thermosetting resin adhesive agents are generally preferred because of their superior properties for electrical applications and generally superior bonding characteristics over extended periods of use and varying conditions. Among the thermosetting adhesive agents which may be employed are epoxies, isocyanates, phenolic elastomers and phenolic-epoxies; nitrile-phenolics have proven particularly advantageous. When a solid film of thermosetting resin is utilized, it is generally necessary that the resin be in a partially cured state.

The specific conditions of bonding will depend upon the materials involved, but generally a temperature of 250 to 500° Fahrenheit and a pressure of 350 to 1800 p.s.i. applied for about ½ to 2½ hours are suitable. The adhesive film is normally utilized in a thickness of about 1–10 mils and preferably about 3–7 mils for most applications. When it is desired to utilize the adhesive layer as the flushing agent for the void areas between the metal pattern of the conducting elements, an adhesive film of greater thickness may be desirable.

In some instances, the bonding layer may flow about the spring in the bonding operation and partially encapsulate it. Since the spring is able to bear upon the surfaces of the contacting elements and establish the necessary electrical contact, this subsequent restriction upon its free action will not normally introduce any significant difficulties. Moreover, it can be seen that the spring will force its way through the interposed bonding layer as this material is soft or softens during the bonding operation to flow under spring pressure. However, this tendency for encapsulation may be undesired for some applications and apertures having modified portions at the surfaces of the body may be provided to permit the material of a continuous film or of a layer on the conducting element to flow thereinto rather than about the spring. In addition, apertures may be stamped through the film or a coating can be applied to the body member to minimize possible flow about the spring when so desired.

The total number of circuits stacked in each assembly may range from two to ten and even more, and the present invention makes it possible to provide a relatively large number of circuits in a small space due to the highly compact nature thereof. By providing the interconnection in the vertical space between superimposed portions of two different circuits, there is virtually no space sacrificed on the surface of the printed circuit for the provision of interconnection means. In addition, since no surface irregularities are inherent in the instant method of interconnection, no surface area need be sacrificed for auxiliary structures to provide suitable contact surfaces. The present assemblies are especially suitable for stacked use in combination with additional assemblies of the same type because the exposed surfaces thereof may be essentially flat and flush, with no projections present to hamper the stacking of one assembly upon another. An assembly containing a multiplicity of vertically superimposed circuits can be made simply by subjecting to heat and pressure a pile containing a number of insulating bodies, bonding interlayers, and conducting members arranged with apertures and springs in the proper relationship to give the desired interconnections. It is also possible to combine two preformed assemblies of the present invention simply by interposing a suitably configured insulating body having apertures and springs with bonding interlayers between the preformed assemblies. Other modifications and adaptations of the present invention will be apparent to those who are skilled in the art.

Exemplary of the efficacy of the present invention is the following specific procedure:

EXAMPLE 1

A sheet of rigid glass-filled epoxy resin 55 mils in thickness is cut to dimensions of about 2⅛ x 4⅛ inches. Locating holes are drilled at opposite ends of the sheet, after which 36 apertures 33 mils in diameter are drilled in the sheet in a predetermined pattern. Two pieces of a heat-treated gold metal alloy foil of 3 mils thickness are then cut to about 2⅛ x 3¼ inches, the nominal composition of the alloy being, on a weight basis, 71.5 parts gold, 8.5 parts platinum, 4.5 parts silver, 14.5 parts copper and 1.0 part zinc. Two pieces of a film of partially cured nitrile-phenolic adhesive 3 mils in thickness are also cut to about the same dimensions as the foil, to serve as bonding interlayers between the pieces of foil and the glass-filled insulating body. A piece of the wrought metal foil is then placed on a support surface, a piece of the nitrile-phenolic film is placed on top of it, and the insulating body is placed upon the bonding film. A compression spring is then inserted into each of the 36 apertures in the insulating body. The springs are gold-flashed stainless steel having an outside diameter of about 32 mils and a length of about 105 mils, the diameter of the spring wire being about 6 mils. The second layer of bonding film is thereafter placed on top of the insulating body containing the springs and the remaining layer of wrought metal foil is placed upon the bonding film.

The resulting sandwich is placed between metal plates coated with tetrafluoroethylene resin in a press and held for 35 minutes at a temperature of about 275–300° Fahrenheit and under a pressure of about 1000 p.s.i. Thereafter, the plates of the press are cooled while maintaining the pressure for a period of time sufficient to render the resulting assembly comfortable to the touch. The assembly is removed from the press and the surfaces thereof etched to produce circuits on either side thereof in a desired configuration utilizing the locating holes provided for exact placement of the patterns relative to the springs, there being as a result 34 interconnected circuits 17 on each side of the insulating body.

Electrical continuity between the interconnected circuits on opposite sides of the assembly is tested and found to be good. Upon filling of the voids between the circuit portions with a partially cured epoxy resin, the printed circuit assemblies are found to be excellently suited for numerous applications due to their smooth flush surfaces and no distortion of the surfaces of the circuit elements is observed at the points of interconnection.

Thus, it can be seen that the simplicity of the printed circuit assemblies and of the method for producing them permits the production of consistently high quality products with a minimum of expense for manpower, materials and losses attributable to rejected off-grade assemblies. Since the steps involved are so few and relatively simple, there is very little opportunity for deviation from established quality standards. Moreover, it is not necessary, as it is with most prior art techniques, to perform manipulative steps to secure the parts in electrical contact or to join the spring to the electrical circuit portions by soldering, welding, etc. The latter feature not only affords savings in manpower and material, but since electrical contact is not dependent upon such joining techniques, the possibility of malfunction due to disconnection is minimal. The virtual elimination of contamination traps (such as may be encountered in methods in which the apertures are metal plated or in which surface irregularities are inherent) also greatly enhances the reliability and proper operation of such assemblies.

Due to the use of the internal springs, the assemblies of the invention may be flexed repeatedly through fairly large angles or subjected to wide and frequent variations in temperature without disruption of the electrical connection. The spring is readily flexed, and it may continuously bear against the circuit portions essentially independent of the angular relationship and the temperature. Since all contact is internal, the outside surfaces are flush and free from irregularities (e.g. holes, solder, etc.) or bumps, making the assemblies highly suitable for wiped contact applications (e.g. with brushes moving directly over one or both surfaces) and for stacking without providing auxiliary contact structure. The appearance of these devices is excellent and they are suitable for a broad range of applications due to the flexibility possible when flexible components are utilized and due to their relatively small size resulting from most efficient utilization of available space.

Having thus described the invention, we claim:

1. A printed circuit assembly comprising:

(A) an insulating body having an aperture therethrough;

(B) a pair of printed circuit members with metallic circuits secured to opposite sides of said body, each of said circuit members having a portion of the circuit thereof extending over said aperture, at least one of said members having at least a portion of the circuit thereof over said aperture exposed at the outer surface for electrical contact with other elements; and (C) an electrically conductive compressible spring under compression in said aperture with one end of said spring in electrical contact with said circuit portion of one of said circuit members, and the other end thereof in electrical contact with said circuit portion of the other of said circuit members secured to the opposite side of said body to provide an electrical connection between said pair of circuit members.

2. The assembly of claim 1 wherein said body and circuit members are secured together by a layer of bonding material interposed therebetween and extending at least partially beyond the margins of said aperture.

3. The assembly of claim 2 wherein said bonding material is a synthetic thermosetting resin.

4. The assembly of claim 1 wherein the material of said spring is selected from the group consisting of precious metal alloys and other metals having a coating of precious metals.

5. The assembly of claim 4 wherein said precious metal is gold.

6. The assembly of claim 1 wherein the metallic circuits of said printed circuit members are fabricated from a noble metal alloy.

7. The assembly of claim 1 wherein at least one of said printed circuit members comprises a wrought metal foil.

8. The assembly of claim 1 wherein said body has a plurality of apertures each having one of said springs therein, and wherein at least one of said circuit members has two circuit portions with each of said portions extending over a different one of said apertures, and wherein the other of said circuit members has a portion of a circuit thereof extending over the opposite ends of said apertures corresponding to said circuit portions of said one circuit member, said springs being under compression in said apertures with one of the ends of each of said springs in electrical contact with the corresponding overlying circuit portion of said one circuit member and with the other ends thereof in electrical contact with said circuit portion of said other member secured to the opposite side of said body to electrically connect each of said two portions through a different one of said springs to said circuit portion of said other member.

9. The assembly of claim 8 wherein said body and circuit member are secured together by a layer of a synthetic thermosetting resin interposed therebetween and extending at least partially beyond the margins of said aperture.

10. In a method for making a printed circuit assembly, the steps comprising:

(A) forming an aperture through an insulating body;

(B) positioning an electrically conductive compressible spring in said aperture;

(C) positioning an electrically conducting member adjacent each side of said insulating body with layers of bonding material interposed therebetween, at least one of said members comprising a metal foil;

(D) bringing said body, layers, and said conducting members into contact with each other and placing said spring under compression; and (E) bonding said body, layers and said conducting members together to secure them in assembly with said spring extending between said conducting members providing electrical connection therebetween.

11. The method of claim 10 including the step of interposing a metal having a low fusing temperature between the ends of said spring and the electrically conducting members extending over said aperture and effecting said bonding step with sufficient heat to soften said metal to provide a metallurgical bond between the ends of said spring and said conducting members.

12. The method of claim 10 wherein said layers are films of heat activatable resinous material and including the step of applying sufficient heat and pressure to said body, layers and said electrically conducting members to render said resinous material adhesive and produce the securing thereof in assembly.

13. The method of claim 10 including the steps of forming a plurality of apertures in said body, positioning a plurality of said springs in said apertures, and bringing said body, layers, and said conducting members into contact with each other and placing said springs under compression with said springs extending between said conducting members providing electrical connection therebetween.

14. The method of claim 10 wherein said layers of bonding material are films of heat activatable resinous material, and including the step of initially applying said films to said insulating body prior to assembly with said conducting members.

15. The method of claim 14 including the step of forming said aperture in said layers of bonding material and insulating body.

16. The method of claim 10 including the step of subsequently etching said metal foil to remove portions thereof and define a circuit pattern therein.

17. The method of claim 16 including the step of adding resin between portions of said circuit pattern to form a surface that is flush with the exposed surface of said pattern.

References Cited

UNITED STATES PATENTS

| | | | |
|---|---|---|---|
| 2,902,628 | 1/1959 | Leno. | |
| 3,327,278 | 6/1967 | Godel | 339—18 |

DARRELL L. CLAY, Primary Examiner

U.S. Cl. X.R.

29—625